United States Patent [19]

Shimizu

[11] Patent Number: 4,533,820
[45] Date of Patent: Aug. 6, 1985

[54] RADIANT HEATING APPARATUS

[75] Inventor: Hiroshi Shimizu, Yokohama, Japan

[73] Assignee: Ushio Denki Kabushiki Kaisha, Tokyo, Japan

[21] Appl. No.: 480,015

[22] Filed: Mar. 29, 1983

[30] Foreign Application Priority Data

Jun. 25, 1982 [JP] Japan .................. 57-108533

[51] Int. Cl.³ .............. C23C 13/08; F27D 11/02; F27B 5/16
[52] U.S. Cl. .................. 219/411; 219/405; 219/390; 219/354; 118/724
[58] Field of Search .......... 219/411, 354, 405, 390, 219/338, 388, 343, 349; 432/253, 198, 194; 118/50.1, 620, 728, 724, 725

[56] References Cited

U.S. PATENT DOCUMENTS

| 3,008,447 | 11/1961 | Lacroix | 118/725 |
| 3,578,495 | 5/1971 | Pammer | 118/725 |
| 3,828,722 | 8/1974 | Reuter | 118/725 |
| 3,836,751 | 9/1974 | Anderson | 219/411 |

OTHER PUBLICATIONS

Whitner; R. A., "Apparatus for the Deposition of Silicon Nitride", Western Electric Technical Digest No. 11, Jul. 1968, pp. 5-6.

Primary Examiner—Roy N. Envall, Jr.
Assistant Examiner—Teresa J. Walberg
Attorney, Agent, or Firm—Ziems, Walter & Shannon

[57] ABSTRACT

Disclosed herein is a photoheating apparatus for heat-treating an object such as silicon semiconductor wafer in a flowing gas of a special composition. It comprises a container adapted to position the object therein, at least one part of the container being transparent, a heat-radiating lamp adapted to irradiate light onto the object through the transparent part of the container, a gas inlet and gas outlet formed through the wall of the container, and a gas flow dispersion barrier disposed within the container so as to confront the gas inlet, defining a plurality of gas through-holes and made of a transparent material. Owing to the provision of the gas flow dispersion barrier, the gas flow is kept uniform downstream the barrier. The photoheating apparatus is small in size and is capable of causing a reaction to proceed at a uniform rate on the whole surface of the object.

1 Claim, 7 Drawing Figures

RADIANT HEATING APPARATUS

BACKGROUND OF THE INVENTION (1) Field of the Invention

This invention relates to a heating apparatus which makes use of light (hereinafter referred to as "radiant heating apparatus"), and more specifically to a radiant heating apparatus equipped as its heat source with lamps such as, for example, halogen lamps so as to irradiate light onto an item to be heated (hereinafter called the "object") and heat it up and adapted for annealing ion-implanted semiconductor wafers, forming oxide films on semiconductor wafers, inducing a chemical reaction or crystal growth on the surface of an object or like purposes.

(2) Description of the Prior Art

Heating apparatus of various types have heretofore been employed for the above-described purposes. Among such known heating apparatus, radiant heating apparatus are advantageous for the heat treatment of silicon semiconductor wafers for the following reasons:

(a) The heating temperature can be rapidly raised or lowered since the heat capacity of each lamp per se is extremely small;

(b) The control of heating temperature can be readily effected by controlling the electricity to be supplied to each lamp;

(c) Objects will be free from contamination since they are heated by light radiated from each lamp without being brought into contact with the heat source;

(d) Energy consumption is smaller because a full-radiation-state operation of each lamp may be achieved shortly after its actuation and the lamp enjoys high energy efficiency;

(e) The apparatus is smaller in size and less costly, compared with other heating furnaces such as resistive furnaces and high-frequency furnaces.

FIG. 1 is a simplified schematic fragmentary view of an example of conventional radiant heating apparatus. In the drawing, numeral 1 indicates plane mirrors which individually define a number of grooves 1a extending in parallel to one another. A tubular halogen lamp 2 is disposed in each of these grooves 1a, thereby making up plane light-source units 10. A plurality of such plane light-source units 10 are arranged up and down or side by side with a space 7 therebetween so as to construct a radiant heating apparatus. The space 7, defined between the units 10, serves as a heating space in which objects are placed for their heat treatment.

Such a radiant heating apparatus may be used as is for heating such objects that are not deleteriously affected when heated in the ambient atmosphere. It however cannot be used as is, where the heat treatment has to be carried out under specific atmospheric conditions. In the heat treatment of a semiconductor wafer for instance, in order to effect desired heat treatment uniformly throughout the wafer, it is required to heat the wafer with uniform temperature distribution to a prescribed temperature under a constant atmospheric condition where a specific gas composition, pressure and the like are maintained unvaried. For example, in order to form a protective film of silicon nitride on the surface of a silicon semiconductor wafer, it is necessary to raise the temperature of the wafer evenly while causing a gas mixture, which consists of a carrier gas of argon and hydrazine ($N_2H_4$) and silane ($SiH_4$) gases mixed with the carrier gas, to flow through the heating chamber in which the wafer is placed. However, it is indispensable to use a container, which isolates the heating chamber from the ambient atmosphere, in order to pass a specific gas through the heating chamber. Moreover, the gas flow in the container must be uniform at the position where the wafer is placed. Since the plane light-source units, which are adapted to heat the wafer placed in the container through the transparent wall of the container, are designed in such a way that the temperature distribution of the wafer exposed to the light from the plane light-source units is maintained uniform in the course of its heating, an uneven gas flow will lead to a non-uniform cooling effect and thus to uneven temperature distribution of the wafer. As a result, the composition and thickness of a protective film to be formed will become uneven.

SUMMARY OF THE INVENTION

The present invention has been completed with the foregoing state of the art in mind. An object of this invention is therefore to provide a novel radiant heating apparatus which permits uniform heating of an object while a gas is caused to flow through a heating chamber where the object is placed.

The radiant heating apparatus according to this invention is small in size and is capable of heating an object to a uniform temperature by light while a gas is caused to flow through its heating chamber in which the object is placed. The radiant heating apparatus of this invention is suitable especially for heating semiconductor wafers.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENTS

Figure 1:
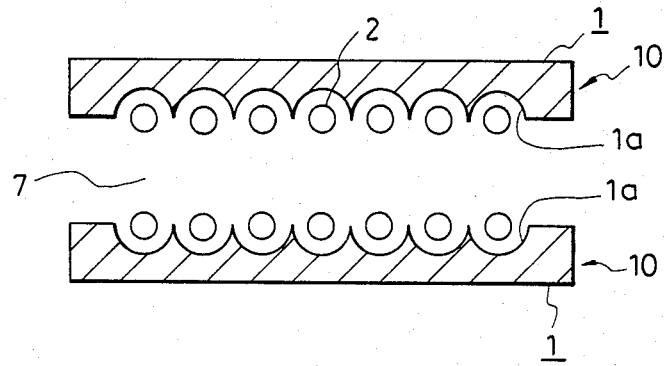
FIG. 1 is a simplified schematic fragmentary illustration of an example of radiant heating apparatus which have heretofore been proposed.
Figure 2:
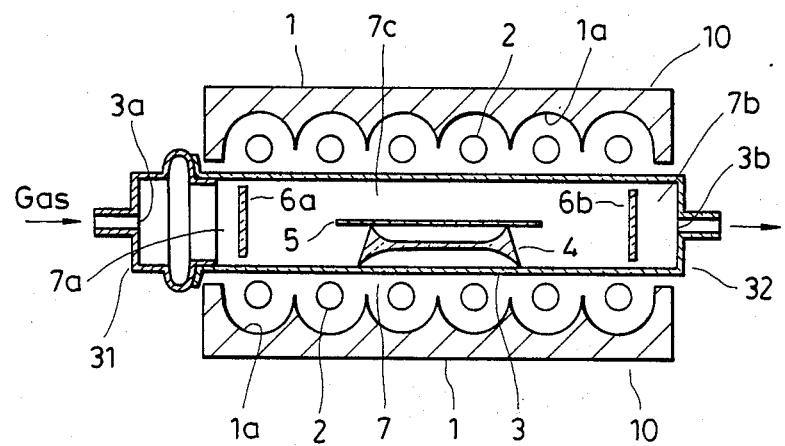
FIG. 2 is a schematic fragmentary view of one embodiment of the radiant heating apparatus according to this invention.

FIG. 2 illustrates, in a simplified fashion, certain essential parts of one embodiment of this invention. A plurality of plane light-source units having the same structure as the plane light-source units shown in FIG. 1 are arranged up and down and/or side by side with a space 7 therebetween. In the space 7, is disposed a transparent container 3 made of quartz. In the container 3, there is placed an object to be heated, for example, a silicon semiconductor wafer 5 held in place on a support 4. It is preferred to make the entire structure of the walls of the container 3 with quartz. However, the container 3 may be transparent only at a part through which light radiated from lamps 2 or further reflected by mirrors 1 is irradiated directly onto the object.

The container 3 is provided with a gas inlet 3a through one of its end walls and a gas outlet 3b through the other end wall thereof. As depicted in the drawing, it is convenient to construct the container 3 by separably combining a first container portion 31 including the gas inlet 3a with a second container portion 32 which defines a heating chamber and includes the gas outlet 3b. Gas flow dispersion barriers 6a,6b are provided in the container 3, confronting the gas inlet 3a and gas outlet 3b respectively. Each of the gas flow dispersion barriers 6a,6b is made of a transparent material such as quartz and formed into such configurations as to cut off the flow passage extending between the gas inlet 3a and the gas outlet 3b. It also defines a plurality of gas through-holes.

Owing to the provision of these gas flow dispersion barriers 6a,6b, a biased (namely, non-uniform) gas flow which occurs due to differences in cross-sectional area between the gas inlet 3a or outlet 3b, which have a small cross-sectional area, and the container 3 which has a large cross-sectional area, is caused to occur in limited regions, namely, the outside of each of the gas flow dispersion barrier 6a,6b, in other words, in a space 7a at the side of the gas inlet 3a and a space 7b at the side of the gas outlet 3b, or their vicinities. Accordingly, the gas flow can be maintained uniform in a space 7c which extends between the gas flow dispersion barriers 6a,6b. By placing an object such as a semiconductor wafer in the space 7c, the object can be uniformly heated by the plane light-source units 10. However, the gas flow may not be uniform everywhere in the space 7c. Namely, it may not necessarily be uniform at locations extremely close to the gas flow dispersion barriers. Unless the gas flow dispersion barriers 6a,6b are provided, the gas flow which is introduced through the gas inlet 3a and is exhausted through the gas outlet 3b remains uneven in a longer region. In such a case, in order to achieve a uniform heat treatment, it becomes necessary to employ a container of a greater length, resulting in a larger apparatus. Provision of the gas flow dispersion barriers 6a,6b as in the present invention can however provide a radiant heating apparatus having a sufficiently long region where the gas flow becomes uniform while keeping the overall size of the radiant heating apparatus small.

It is important to make the above-described gas flow dispersion barriers 6a,6b with a transparent material. If they should be made of any opaque material, they absorb a part of light radiated from the lamps 2 and become hotter. As a result, the gas flow dispersion barriers may be broken or may become sources for gaseous impurities, thereby adversely affecting the function of the apparatus to keep the temperature distribution of a wafer uniform or deteriorating the characteristics of the wafer. Such a problem can be successfully avoided if the gas flow dispersion barriers are made of a transparent material such as quartz or the like.

Figure 3:
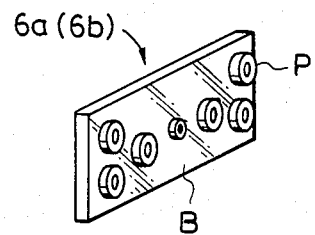
FIG. 3 is a perspective view of one embodiment of a gas flow dispersion barrier incorporated in the radiant heating apparatus of FIG. 2.
Figure 4:
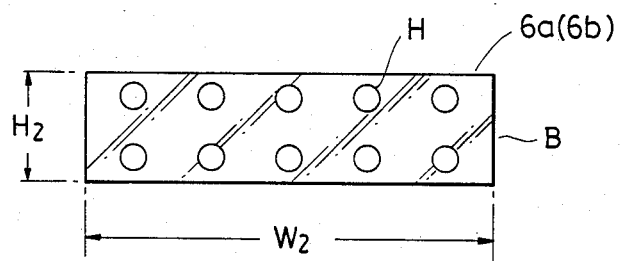
FIG. 4 is a front elevation of another embodiment of the gas flow dispersion barrier.

FIG. 3 is a perspective view showing a specific example of the gas flow dispersion barrier 6a or 6b. It is formed of a quartz plate B having a contour conforming to the cross-sectional configurations of the container 3 and seven short quartz-made pipes P extending through the quartz plate B and fusion-bonded thereto. FIG. 4 illustrates another embodiment of the gas flow dispersion barrier, in which ten through-holes H are formed through a quartz plate B. A variety of specific structures may be contemplated as effective structures of the gas flow dispersion barrier. A suitable structure may be determined in accordance with the shape of the container 3, the gas inlet 3a, the gas outlet 3b, gas flow velocity and other conditions. "Glass nets" made of crystallized glass may be used effectively as such gas flow dispersion barriers. Although the gas flow dispersion barrier 6a confronting the gas inlet 3a is essential, the gas flow dispersion barrier 6b disposed in a face-to-face relation with the gas outlet 3b may be omitted because non-uniformity in gas flow downstream of the object does not have a serious deleterious influence. In addition, each of the gas flow dispersion barriers may be formed of members arranged in two or more layers.

The present invention will next be described in further detail in the following Experiments in which silicon semiconductor wafers were subjected to a heat treatment in a flowing gaseous atmosphere, using a radiant heating apparatus of this invention.

EXPERIMENT 1

Figure 5:
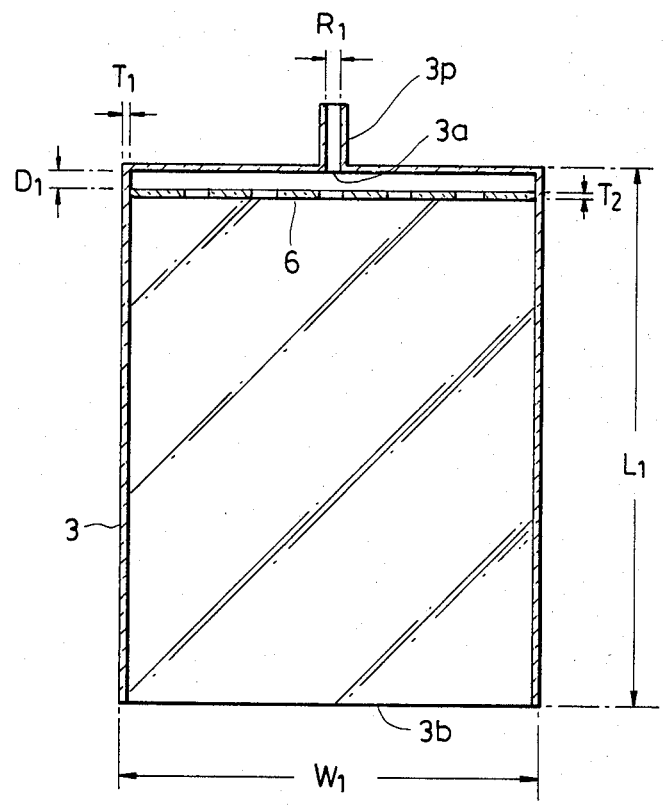
FIG. 5 is a cross-sectional plan view of a container and a gas flow dispersion barrier combined with the container, which container and gas flow , dispersion barrier were employed in Experiments.
Figure 6:
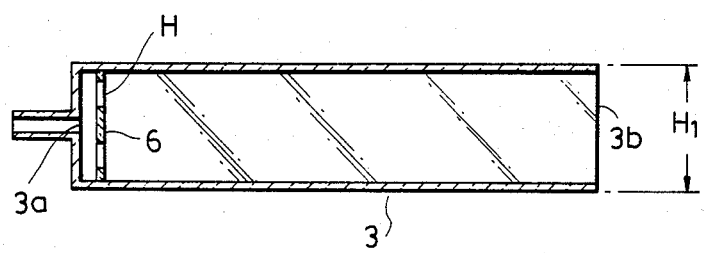
FIG. 6 is a cross-sectional side view of the container and gas flow dispersion barrier depicted in FIG. 5.

FIGS. 5 and 6 illustrate a container 3 employed in the present Experiment. The container 3 is made of quartz and formed into a flattened parallelepipedal shape. It is provided at the center of one of its end walls with a tube 3p which forms the gas inlet 3a. The other end wall is kept open, thereby forming the gas outlet 3b. The container 3 has the following dimensions:

| | |
|---|---|
| Length ($L_1$) | 264 mm; |
| Width ($W_1$) | 210 mm; |
| Height ($H_1$) | 60 mm; |
| Wall thickness ($T_1$) | 3 mm. |

A gas flow dispersion barrier 6 is provided at such a location that its distance $D_1$ from the inner surface of the one end wall of the container 3 is 10 mm. The gas flow dispersion barrier 6 has the same configurations as the embodiment shown in FIG. 4 and its dimensions are as follows:

| | |
|---|---|
| Width ($W_2$) | 204 mm; |
| Height ($H_2$) | 54 mm; |
| Thickness ($T_2$) | 3 mm. |

The gas flow dispersion barrier 6 defines ten through-holes H having a diameter of 10 mm, in two rows, namely, 5 holes in the upper row and the remaining 5 holes in the lower row. It is fixedly secured in place along its circumferential edge on the inner circumferential surface of the container 3.

Figure 7:
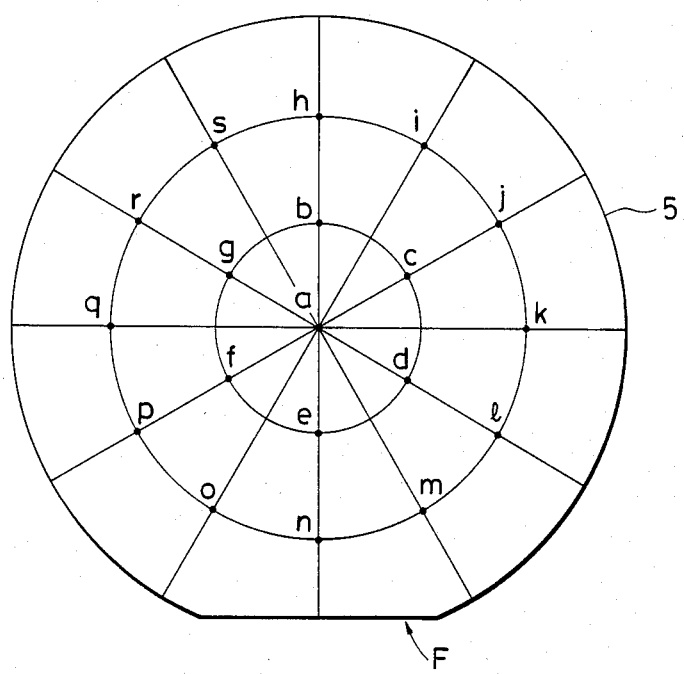
FIG. 7 illustrates an arrangement of points on a wafer, at which points temperatures were measured.

A mirror-polished silicon semiconductor wafer of 4 inches in diameter was positioned in the center of the container 3 by holding the wafer on a quartz-made support. Thereafter, light was irradiated onto the wafer from the plane light-source units—each of which units was constructed by arranging 12 halogen lamps each of 2 KW rated power consumption—provided respectively in upper and lower parts of the container 3 while introducing a gas mixture of argon with oxygen in such an amount that the partial pressure of oxygen would have become 130 mmHg, at a flow velocity of 2000 cm$^3$/minute through the gas inlet 3a. After an elapsed time of 3 minutes from the turning on of the lamps, the thickness of the oxide film formed on the surface of the wafer was measured at various points by means of an ellipsometer. Namely, as shown in FIG. 7, thicknesses of the oxide film were measured at the central point a of the wafer 5, and 6 points b–g arranged along a small circle as well as 12 points h–s distributed along a large circle, namely, at 19 points in total. Measurement results are as follows. Incidentally, the letter F stands for "orientation flat" in FIG. 7.

| | | |
|---|---|---|
| a = 213.6 Å | b = 219.2 Å | c = 212.1 Å |
| d = 209.8 Å | e = 216.1 Å | f = 211.7 Å |
| g = 216.5 Å | h = 211.4 Å | i = 211.9 Å |
| j = 210.7 Å | k = 206.3 Å | l = 209.3 Å |
| m = 211.7 Å | n = 214.4 Å | o = 215.6 Å |
| p = 217.2 Å | q = 218.9 Å | r = 217.9 Å |
| s = 214.9 Å | | |

As a result of the present Experiment, there was formed a uniform oxide film having an average film thickness of 213.6 Å (standard deviation: 3.52 Å).

EXPERIMENT 2

Similar to Experiment 1, the thickness of the oxide film formed on the surface of a wafer was measured at various points after an elapsed time of 1 minutes. Results are as follows:

| | | |
|---|---|---|
| a = 500.0 Å | b = 515.8 Å | c = 502.9 Å |
| d = 503.5 Å | e = 502.7 Å | f = 503.1 Å |
| g = 510.3 Å | h = 508.2 Å | i = 500.1 Å |
| j = 500.5 Å | k = 494.5 Å | l = 494.0 Å |
| m = 490.2 Å | n = 489.4 Å | o = 489.7 Å |
| p = 500.2 Å | q = 510.5 Å | r = 516.8 Å |
| s = 516.2 Å | | |

-continued

As a result of the present Experiment, there was formed a uniform oxide film having an average film thickness of 502.6 Å (standard deviation: 8.7 Å).

The procedure of the above-described Experiment 1 was repeated except that the gas flow dispersion barrier 6 was removed from the container 3. The average film thickness of an oxide film formed was 215.5 Å and its standard deviation was 28.2 Å. The thickness difference between the thickest film spot and the thinnest film spot was 103.8 Å, which was far greater than 12.9 Å, the maximal thickness difference measured in Experiment 1. Accordingly, the oxide film was too uneven to render the resultant product suitable for actual use.

Having now fully described the invention, it will be apparent to one of ordinary skill in the art that many changes and modifications can be made thereto without departing from the spirit or scope of the invention as set forth herein.

What is claimed is:

1. A radiant heating apparatus comprising:
   a container having a wall, said container being adapted to position an item to be heated therein, at least one part of said container being transparent;
   a heat-radiating lamp irradiating light onto said item through the transparent part of said container;
   a gas inlet and gas outlet formed through the wall of said container; and
   means for maintaining uniformly dispersed gas flow across said container where the item is positioned, said uniform gas flow maintaining means including a gas flow dispersion barrier made of material transparent to said irradiated light, whereby the barrier does not become heated, and disposed within said container so as to substantially confront said gas inlet, said gas flow dispersion barrier defining a plurality of gas through-holes.

* * * * *

UNITED STATES PATENT AND TRADEMARK OFFICE
CERTIFICATE OF CORRECTION

PATENT NO. : 4,533,820
DATED : August 6, 1985
INVENTOR(S) : Hiroshi Shimizu

It is certified that error appears in the above-identified patent and that said Letters Patent is hereby corrected as shown below:

Column 5, line 32, "1" should read --10--.

Signed and Sealed this

Tenth Day of December 1985

[SEAL]

Attest:

DONALD J. QUIGG

Attesting Officer

Commissioner of Patents and Trademarks